(12) United States Patent
Chen et al.

(10) Patent No.: US 7,297,951 B2
(45) Date of Patent: Nov. 20, 2007

(54) TWO F-NUMBER, TWO-COLOR SENSOR SYSTEM

(75) Inventors: Chungte W. Chen, Irvine, CA (US); John S. Anderson, Santa Monica, CA (US)

(73) Assignee: Raytheon Company, Waltham, MA (US)

( * ) Notice: Subject to any disclaimer, the term of this patent is extended or adjusted under 35 U.S.C. 154(b) by 202 days.

(21) Appl. No.: 11/190,688

(22) Filed: Jul. 27, 2005

(65) Prior Publication Data

US 2007/0023663 A1 Feb. 1, 2007

(51) Int. Cl.
  *G01J 5/02* (2006.01)
(52) U.S. Cl. ................................. 250/339.02
(58) Field of Classification Search ............ 250/339.02
  See application file for complete search history.

(56) References Cited

U.S. PATENT DOCUMENTS

| | | | |
|---|---|---|---|
| 4,996,427 A | | 2/1991 | Noble et al. |
| 5,075,553 A | * | 12/1991 | Noble et al. ................. 250/352 |
| 5,113,076 A | | 5/1992 | Schulte |
| 5,258,618 A | | 11/1993 | Noble et al. |
| 5,343,542 A | | 8/1994 | Kash et al. |
| 5,457,331 A | | 10/1995 | Kosai et al. |
| 5,751,473 A | * | 5/1998 | Runciman .................... 359/356 |
| 5,959,339 A | | 9/1999 | Chapman et al. |
| 6,034,372 A | | 3/2000 | LeVan et al. |
| 6,618,199 B2 | | 9/2003 | Cook |
| 6,700,706 B2 | | 3/2004 | Chang et al. |
| 7,157,706 B2 | * | 1/2007 | Gat et al. ................. 250/338.1 |
| 2004/0211907 A1 | | 10/2004 | Wellman et al. |
| 2004/0238741 A1 | * | 12/2004 | Gat et al. ................. 250/338.1 |
| 2006/0255275 A1 | * | 11/2006 | Garman et al. .......... 250/338.1 |
| 2006/0274431 A1 | * | 12/2006 | Wood et al. ................. 359/722 |

* cited by examiner

*Primary Examiner*—David Porta
*Assistant Examiner*—Christopher Webb
(74) *Attorney, Agent, or Firm*—Leonard A. Alkov

(57) ABSTRACT

A sensor system senses a scene and includes a dual-band imaging infrared detector lying on a beam path, wherein the infrared detector detects infrared images in a first infrared wavelength band and in a second infrared wavelength band; and a two-color cold-shield filter lying on the beam path between the infrared detector and the scene. The cold-shield filter defines a first aperture size for infrared light of the first infrared wavelength band, and a second aperture size larger than the first aperture size for infrared light of the second infrared wavelength band. The first infrared wavelength band has wavelengths less than wavelengths of the second infrared wavelength band.

26 Claims, 3 Drawing Sheets

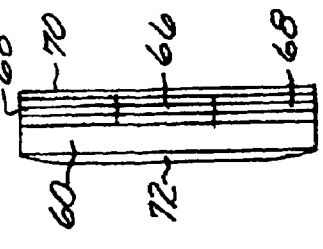
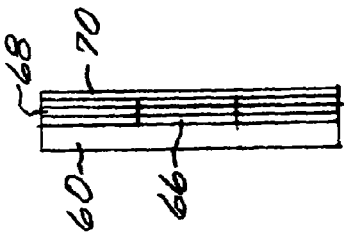
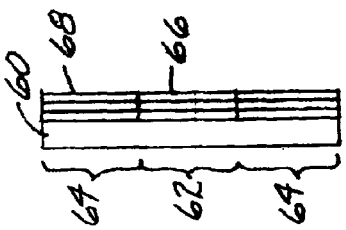
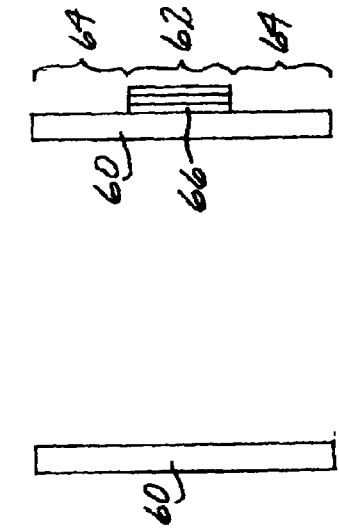
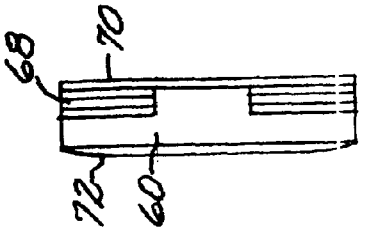
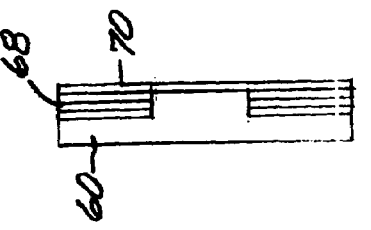
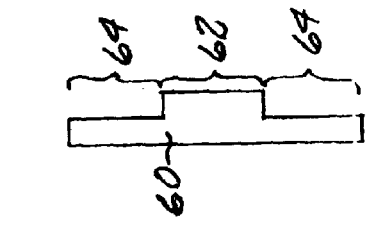
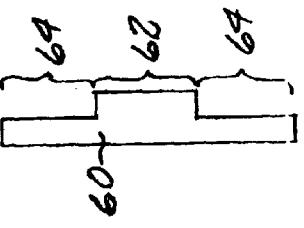
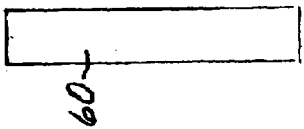

TWO F-NUMBER, TWO-COLOR SENSOR SYSTEM

This invention relates to a sensor system and, more particularly, to an imaging infrared sensor system that senses a scene in two different infrared wavelength bands.

BACKGROUND OF THE INVENTION

Imaging infrared sensors image the light from a scene in the infrared wavelength range of about 0.9 micrometers to about 12 micrometers and in some cases to even longer infrared wavelengths. By contrast, visible-light sensors operate in shorter wavelengths below about 0.9 micrometers. Infrared sensor are preferred to visible-light sensors for many applications, because the infrared sensor can often image a scene through clouds, dust, and other obstructions that obscure the visible-light scene.

In a further refinement, more-recent infrared sensors include the capability to image a scene in two different infrared wavelength bands. For example, the scene may be simultaneously imaged in the medium-wavelength infrared (MWIR) band and the long-wavelength infrared (LWIR) band. The simultaneous images in two different infrared wavelength bands may be used to determine the nature of some types of features, whose characters cannot be determined either by visible light or by imaging in a single infrared wavelength band.

Complications arise when the scene is imaged in two different infrared wavelength bands. Diffraction of the light is wavelength dependent, so that the point spread function is wavelength dependent. If MWIR and LWIR wavelengths are imaged through the same aperture, the point spread function is significantly larger for the LWIR wavelengths than for the MWIR wavelengths, with the result that the MWIR image is "sharper" than the LWIR image. This difference in the images makes it difficult to compare the two images by digital analysis techniques. On the other hand, it is known to split the input beam into beams of the two different wavelength ranges, pass the two beams through different apertures, and separately image the two beams onto different infrared detectors. While operable, this technique significantly increases the cost of the sensor system by requiring two infrared detectors, and by requiring that the cooling system be substantially larger than would otherwise be the case.

There is a need to improve dual-band infrared imaging to achieve satisfactory image quality while reducing the cost of the sensor system and the envelope size of the sensor system. The present invention fulfills this need, and further provides related advantages.

SUMMARY OF THE INVENTION

The present invention provides an imaging sensor system that images two different wavelength bands with a single dual-band imaging detector. The two different wavelength bands may include two wavelength bands in the visible, two wavelength bands in the infrared (the preferred case), or one wavelength band in the visible and one wavelength band in the infrared. The optical system compensates for the wavelength-dependent diffraction effects so that the images obtained at the two different wavelengths are comparable. The performance for the longer-wavelength image is significantly improved over what it would otherwise be. The improved performance is obtained with a less-costly, more compact structure that requires less cooling power than alternative approaches.

In accordance with the invention, a sensor system for sensing a scene comprises a dual-band imaging detector lying on a beam path from the scene, wherein the detector detects images in a first wavelength band and in a second wavelength band, and a two-color cold-shield filter lying on the beam path between the detector and the scene. A first filter portion of the cold-shield filter passes light of the first wavelength band and the second wavelength band, and a second filter portion of the cold-shield filter does not pass light of the first wavelength band but passes light of the second wavelength band. Preferably, at least one, and more preferably both, of the wavelength bands imaged by the detector are in the infrared.

Desirably, the first filter portion is a circle centered on the beam path, and the second filter portion is a circular annulus centered on the beam path. Most preferably, an outer diameter of the circle is an inner diameter of the annulus. The outer diameter of the circle thereby defines a first aperture of a first F-number for the first wavelength, and the outer diameter of the annulus defines a second aperture of a second F-number for the second wavelength. The first wavelength band comprises wavelengths less than wavelengths of the second wavelength band. In a case of most interest, the first wavelength band is in the infrared and from about 3 to about 5 micrometers wavelength (the Medium Wavelength Infrared or MWIR wavelength band), and the second wavelength band is in the infrared from about 8 to about 12 micrometers wavelength (the Long Wavelength Infrared or LWIR wavelength band).

In a practical application, a cooler housing such as a cryogenic cooler housing encloses the detector and the cold-shield filter. The cooler housing includes a window to admit the beam path to an interior of the cooler housing. A telescope and an imager lie on the beam path outside of the cooler housing. The telescope and the imager image the scene through the cold-shield filter and onto the detector that is within the cooler housing.

The cold-shield filter may be conveniently formed by depositing one or more thin-film filters onto a substrate. In one embodiment, the cold-shield filter comprises a substrate having a first substrate portion corresponding to the first filter portion and a second substrate portion corresponding to the second filter portion, a first multilayer bandpass coating overlying the first substrate portion, and a second multilayer bandpass coating overlying the second substrate portion. In another embodiment, the cold-shield filter comprises a substrate having a first substrate portion corresponding to the first filter portion and a second substrate portion corresponding to the second filter portion, and a second multilayer bandpass coating overlying the second substrate portion.

There may additionally be an aberration corrector for the cold-shield filter, wherein the aberration corrector lies in the beam path. The aberration corrector may conveniently be affixed to the cold-shield filter, as for example a Schmidt Corrector affixed to one of the faces of the cold-shield filter.

In an embodiment of particular interest, a sensor system for sensing a scene comprises a dual-band imaging infrared detector lying on a beam path from the scene, wherein the infrared detector detects infrared images in the first infrared wavelength band and in a second infrared wavelength band, and a two-color cold-shield filter lying on the beam path between the infrared detector and the scene. A circular first filter portion of the cold-shield filter passes infrared light of the first infrared wavelength band and the second infrared wavelength band. The first infrared wavelength band comprises wavelengths less than wavelengths of the second infrared wavelength band. An annular second filter portion of the cold-shield filter does not pass infrared light of the first infrared wavelength band and passes infrared light of the second infrared wavelength band. An outer diameter of the circle is an inner diameter of the annulus. A cooler housing encloses the infrared detector and the cold-shield filter. The cooler housing includes a window to admit the beam path to an interior of the cooler housing. Other operable features discussed herein may be used with this embodiment.

More generally, a sensor system for sensing a scene comprises a dual-band imaging infrared detector lying on a beam path. The infrared detector detects infrared images in a first infrared wavelength band and in a second infrared wavelength band. A two-color cold-shield filter lies on the beam path between the infrared detector and the scene. The cold-shield filter defines a first aperture size for infrared light of the first infrared wavelength band, and a second aperture size larger than the first aperture size for infrared light of the second infrared wavelength band. The first infrared wavelength band comprises wavelengths less than wavelengths of the second infrared wavelength band.

By defining a relatively smaller aperture (larger F-number) for the shorter wavelength band and a relatively larger aperture (smaller F-number) for the longer wavelength band, the point spread function of the longer wavelength band is reduced in size to be comparable with that of the shorter wavelength band. The result is that the two images from the two wavelength bands are made more nearly comparable, and the quality of the image associated with the longer wavelength band is improved.

The present detector structure is simple to fabricate and to keep in alignment. There are only two parts in the detector structure, the detector and the cold-shield filter, and no moving parts. There is no beamsplitter and no multiple detectors that must be fabricated and maintained in alignment during service.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 4A-4E are a series of elevational views illustrating the steps in a process for fabricating a first embodiment of the cold-shield filter; and FIGS. 5A-5E are a series of elevational views illustrating the steps in a process for fabricating a second embodiment of the cold-shield filter.

DETAILED DESCRIPTION OF THE INVENTION

Figure 1:
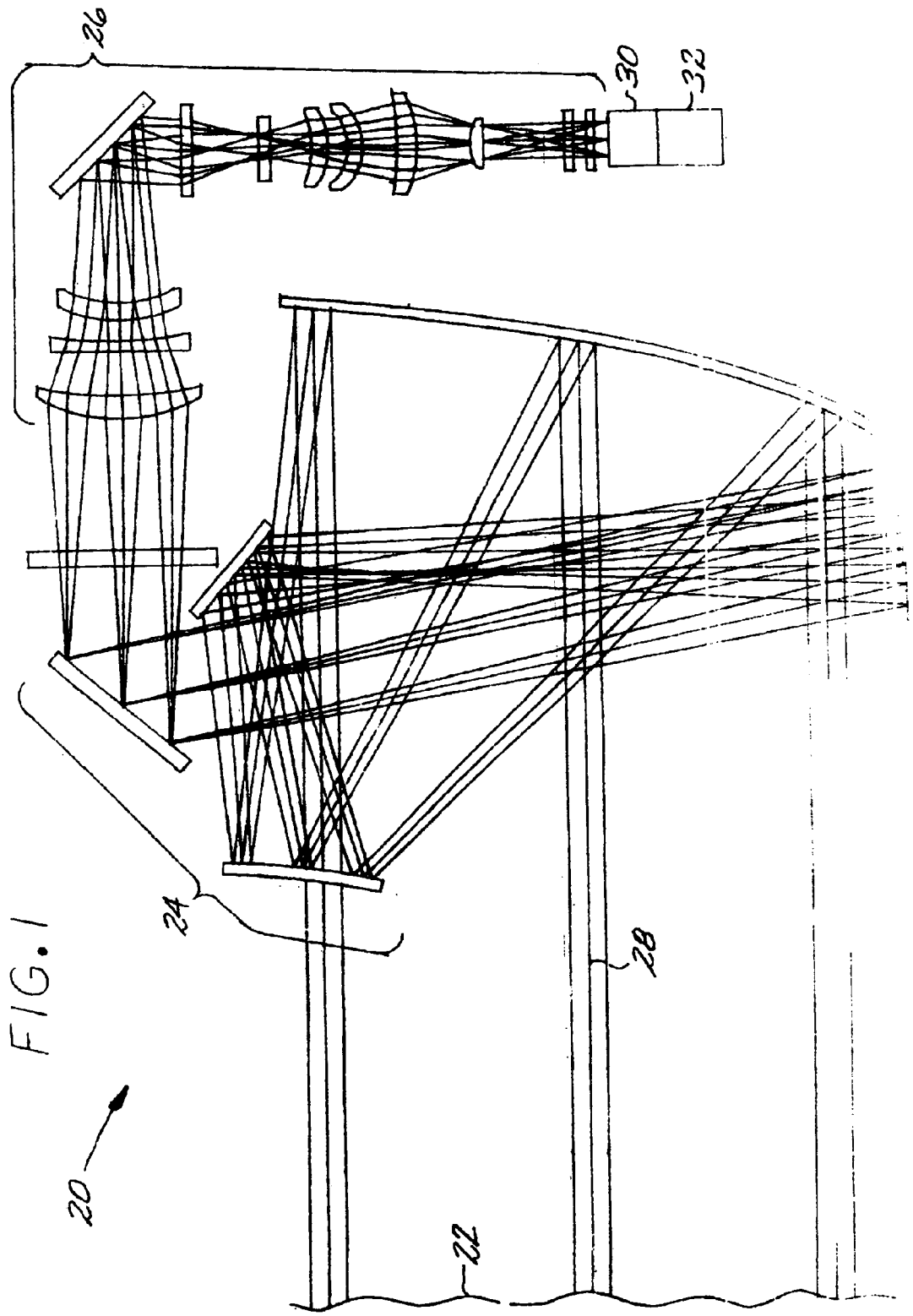
FIG. 1 is a schematic elevational view of an infrared sensor system.

FIG. 1 depicts a preferred embodiment of a sensor system 20 for sensing and imaging a scene 22. The most-preferred embodiment is designed for use in the infrared, and the following description is directed to this most-preferred embodiment. The illustrated infrared sensor system 20 includes a telescope 24, in this case formed by a series of mirrors, and an imager 26, in this case a series of lenses, lying on a beam path 28. (The telescope 24 may instead be refractive, and the imager 26 may be reflective, or each of these components may use a mix of reflective and refractive optics.) The telescope 24 and the imager 26 image the scene 22 to a detector structure 30 that also lies on the beam path 28. For infrared applications, an interior of the detector structure 30 is typically cooled to a reduced temperature, such as a cryogenic temperature near the temperature of liquid nitrogen, by a refrigerator 32, such as a Joule-Thomson refrigerator. Any operable telescope 24, imager 26, and refrigerator 32 may be used.

Figure 2:
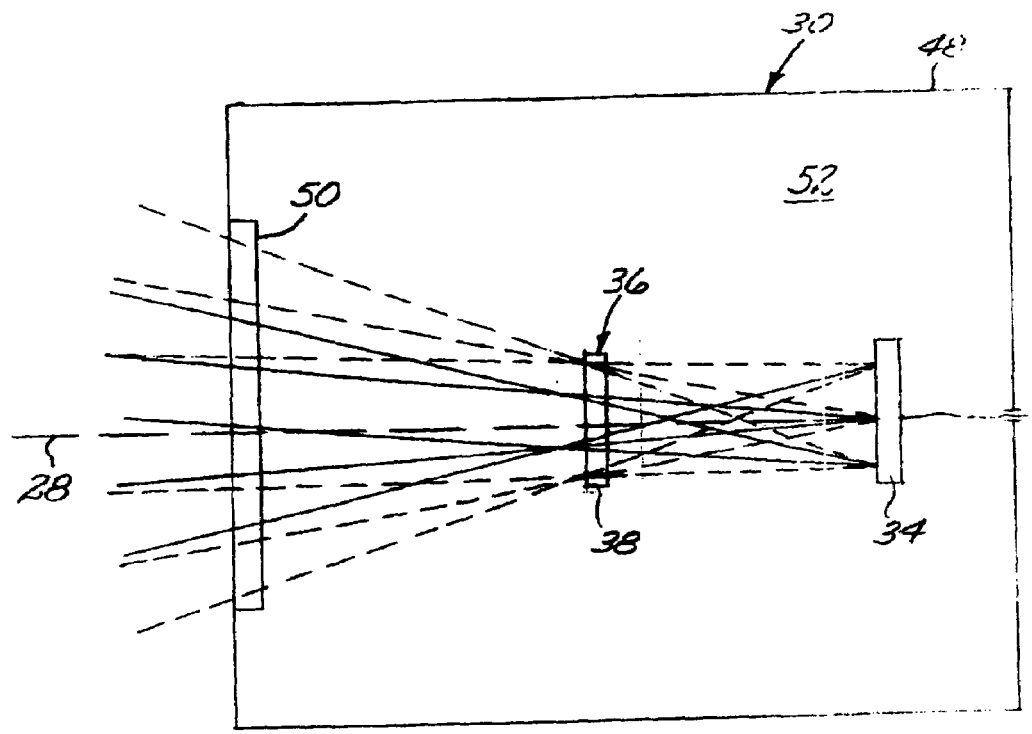
FIG. 2 is a schematic elevational interior view of a cooler housing, showing the cold-shield filter and the imaging infrared detector.

The detector structure 30 is shown in greater detail in FIG. 2. The detector structure 30, and thence the sensor system 20, includes a dual-band imaging infrared detector 34 lying on the beam path 28 from the scene 22. The single infrared detector 34 detects infrared images in two different infrared wavelength bands, specifically a first infrared wavelength band and a second infrared wavelength band. Because infrared light is light, comparable terminology to that used in discussing visible light is used in some instances. For example, the two different wavelength bands are often referred to as two different "color" bands. In a case of most interest, the detector 34 images in the medium-wavelength infrared (MWIR) band of from about 3 to about 5 micrometers wavelength, and in the long-wavelength infrared (LWIR) band of from about 8 to about 12 micrometers wavelength. Dual-band imaging infrared detectors 34 are known in the art, see for example U.S. Pat. Nos. 5,959,339; 5,113,076; and 5,457,331, whose disclosures are incorporated by reference.

The scene 22 is imaged through an aperture structure 36 onto the detector 34 by the telescope 24 and the imager 26. If a single-size aperture structure is used for the two different wavelength bands (a structure that is not within the scope of the present invention), the longer-wavelength band has a point spread function on the infrared detector 34 that is larger than the point spread function of the shorter-wavelength band. The larger point spread function of the longer-wavelength band causes the images of the two different wavelength bands to be different, and also reduces the resolution of the image formed by the light of the longer-wavelength band. One possible approach to improving upon this situation is to split the beam incoming to the detector structure into two beams of the different wavelength bands, and to pass these two subbeams through differently sized apertures and onto two different single-wavelength band detectors. This alternative approach, which is not within the scope of the present invention, is significantly more costly to implement due to the need for two detectors, and also increases the size of the detector structure and the volume that must be cooled.

Figure 3:
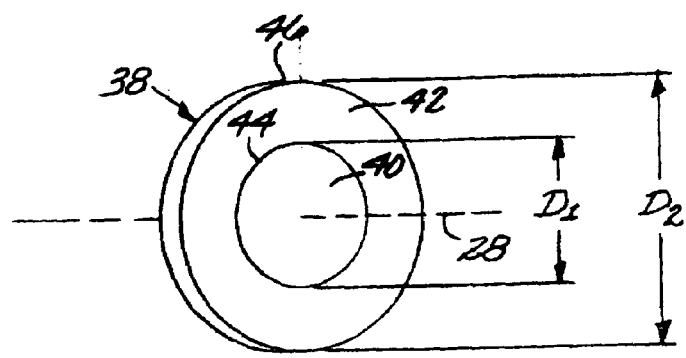
FIG. 3 is a perspective view of the cold-shield filter.

In the present approach, a two-color cold-shield filter 38 lies on the beam path 28 between the infrared detector 34 and the scene 22, most preferably within the cooled interior 52 of a cooler housing 48. The cold-shield filter 38, shown in FIG. 2 and in greater detail in FIG. 3, is structured such that a first filter portion 40 of the cold-shield filter 38 passes infrared light of the first infrared wavelength band and also the second infrared wavelength band (the same two wavelength bands imaged by the detector 34). A second filter portion 42 of the cold-shield filter 38 does not pass infrared light of the first infrared wavelength band but passes infrared light of the second infrared wavelength band. Preferably, the first filter portion 40 is a circle centered on the beam path 28, and the second filter portion 42 is a circular annulus centered on the beam path 28, as may be seen in FIG. 3. Most preferably, an outer diameter of the circle of the first filter portion 40 is an inner diameter of the annulus of the second filter portion 42.

The first filter portion 40 defines a first aperture 44 having a diameter D1 (and an associated larger F-number), and the second filter portion defines a second aperture 46 having a diameter D2 (and an associated smaller F-number). The first aperture 44 serves as an aperture for the first (shorter or MWIR) infrared wavelength band, because the second filter portion 42 does not pass light of the first infrared wavelength band. The second aperture 46 serves as an aperture for the second (longer or LWIR) infrared wavelength band, because both the first filter portion 40 and the second filter portion 42 of the cold-shield filter 38 pass light of the second infrared wavelength band. Thus, the cold-shield filter 38 having a single integral structure and no moving parts provides the functionality of two apertures for the different wavelength bands and two F-numbers.

The preferred detector structure 30 includes the cooler housing 48 (FIG. 2) enclosing the infrared detector 34 and the cold-shield filter 38. This arrangement keeps the cold-shield filter 38 cool, to reduce background thermal radiation that is within the field of view of the infrared detector 34. The cooler housing 48 includes a window 50 to admit the beam path 28 to the interior 52 of the cooler housing 48, so that the beam path 28 may pass through the cold-shield filter 38 and be incident upon the infrared detector 34. The cooler housing 48 and its interior 52, and thence the infrared detector 34 and the cold-shield filter 38, are cooled by the refrigerator 32. The cooler housing 48 may be a vacuum housing, in which case the interior 52 of the cooler housing 48 is evacuated. The cooler housing 48 serves the dual functions of maintaining the temperature of the infrared detector 34 and the cold-shield filter 38, and also protecting them against contamination from external sources.

FIGS. 4 and 5 illustrate manufacturing sequences for two different embodiments of the structures of the cold-shield filter 38. In the first embodiment of FIGS. 4A-E, the cold-shield filter 38 comprises a substrate 60 (FIG. 4A) having a first substrate portion 62 corresponding to the first filter portion 40 and a second substrate portion 64 corresponding to the second filter portion 42 (FIG. 4B). A first multilayer bandpass coating 66 is deposited to overlie the first substrate portion 62 (FIG. 4B), and a second multilayer bandpass coating 68 overlies the second substrate portion 64 (FIG. 4C). The bandpass filters may be designed to pass only a specific range of wavelengths, or they may be designed as edge filters to pass all light above or below a certain edge wavelength. The multilayer bandpass coatings 66 and 68 are multilayer structures designed to pass only certain wavelengths of light and to reflect or absorb other wavelengths of light. Such multilayer bandpass coatings are known in the art for other applications, such as for Fabry-Perot filters. See, for example, U.S. Pat. Nos. 5,343,542; 6,618,199; and 6,700,706, whose disclosures are incorporated by reference. In the present case, the first multilayer bandpass coating 66 is designed to pass the first infrared wavelength band and the second infrared wavelength band. The second multilayer bandpass coating 68 is designed to pass the second infrared wavelength band but to reflect or absorb (but not pass) the first infrared wavelength band.

FIGS. 4A-4E depict a sequence for fabricating this first embodiment. The substrate 60 is first provided, FIG. 4A. For the present application wherein the first infrared wavelength band is the MWIR band and the second infrared wavelength band is the LWIR band, the substrate 60 is preferably made of germanium about 2 millimeters thick. The first multilayer bandpass coating 66 is deposited overlying the first substrate portion 60, FIG. 4B. For the present application, the first multilayer bandpass coating 66 is preferably made of alternating layers of zinc sulfide and germanium. The second multilayer bandpass coating 68 is deposited overlying the second substrate portion 62, FIG. 4C. For the present application, the second multilayer bandpass coating 68 is also preferably made of alternating layers of zinc sulfide and germanium, of different thicknesses than those of the first multilayer bandpass coating 66. (The order of the process steps of FIGS. 4B and 4C may be reversed, so that the second multilayer bandpass coating 68 is first deposited, followed by the second multilayer bandpass coating 66. Optionally, an antireflection coating 70 is deposited overlying both the first multilayer bandpass coating 66 and the second multilayer bandpass coating 68, FIG. 4D Multilayer antireflection coatings are known in the art for other applications, and operate on much the same principles as the multilayer bandpass coatings 66 and 68 except reflect all relevant wavelengths. Optionally, an optical corrector 72 may be affixed or deposited upon the structure, preferably on the side of the substrate 70 away from the anti-reflection coating 70 to lie in the beam path 28, FIG. 4E. The optical corrector 72, such as a Schmidt corrector, acts as a lens to reduce aberrations in the light beam incident upon the multilayer bandpass coatings 66 and 68, and thence reaching the infrared detector 34.

FIGS. 5 depicts a second embodiment of the cold-shield filter 38. Features similar to those of the first embodiment of FIGS. 4 are assigned the same callout numbers, and the prior description is incorporated here. In this embodiment, no first multilayer bandpass coating is used, and only the second multilayer bandpass coating 68 is present to overlie the second substrate portion 64. This embodiment has the advantage that it is not necessary to deposit the first multilayer bandpass coating, saving fabrication costs. However, this embodiment permits all wavelengths of light to reach the infrared detector 34 through the first substrate portion 62, a disadvantage in some applications.

FIGS. 5A-5E depict a sequence for fabricating this second embodiment. The substrate 60 is first provided, FIG. 5A. The substrate 60 is etched to remove a portion of the thickness thereof in the second substrate portion 64, FIG. 5B. The second multilayer bandpass coating 68 is deposited overlying the second substrate portion 64, FIG. 5C. Optionally, the antireflection coating 70 is deposited, FIG. 5D, and the optical corrector is affixed or deposited, FIG. 5E. The antireflection coating 70, where used, is deposited over the unetched first substrate portion 62 and the second multilayer bandpass coating 68. For this reason, the depth of the etching in FIG. 5B is preferably exactly the optical thickness of the second multilayer bandpass coating 68, so that the antireflection coating 70 may be deposited upon a substantially flat surface.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A sensor system for sensing a scene, the sensor system comprising:
   a dual-band imaging detector lying on a beam path from the scene, wherein the detector detects images in a first wavelength band and in a second wavelength band;

a two-color cold-shield filter lying on the beam path between the detector and the scene, wherein
   a first filter portion of the cold-shield filter passes light of the first wavelength band and the second wavelength band, and
   a second filter portion of the cold-shield filter does not pass light of the first wavelength band and passes light of the second wavelength band; and
a telescope and an imager lying on the bean, path, wherein the telescope and the imager image the scene through the cold-shield filter and onto the detector.

2. The sensor system of claim 1, wherein the first filter portion is a circle centered on the beam path, and the second filter portion is a circular annulus centered on the beam path.

3. The sensor system of claim 1, wherein the first filter portion is a circle centered on the beam path, and the second filter portion is a circular annulus centered on the beam path, and wherein an outer diameter of the circle is an inner diameter of the annulus.

4. The sensor system of claim 1, wherein the first wavelength band comprises wavelengths less than wavelengths of the second wavelength band.

5. The sensor system of claim 1, wherein the first wavelength band is from about 3 to about 5 micrometers wavelength, and the second wavelength band is from about 8 to about 12 micrometers wavelength.

6. The sensor system of claim 1, further including a cooler housing enclosing the detector and the cold-shield filter, wherein the cooler housing includes a window to admit the beam path to an interior of the cooler housing.

7. The sensor system of claim 1, wherein the cold-shield filter comprises
   a substrate having a first substrate portion corresponding to the first filter portion and a second substrate portion corresponding to the second filter portion,
   a first multilayer bandpass coating overlying the first substrate portion, and
   a second multilayer bandpass coating overlying the second substrate portion.

8. The sensor system of claim 1, wherein the cold-shield filter comprises
   a substrate having a first substrate portion corresponding to the first filter portion and a second substrate portion corresponding to the second filter portion, and
   a second multilayer bandpass coating overlying the second substrate portion.

9. The sensor system of claim 1, further including
an optical aberration corrector for the cold-shield filter, wherein the optical aberration corrector lies in the beam path.

10. A sensor system for sensing a scene, the sensor system comprising:
   a dual-band imaging infrared detector lying on a beam path from the scene, wherein the infrared detector detects infrared images in a first infrared wavelength band and in a second infrared wavelength band;
   a two-color cold-shield filter lying on the beam path between the infrared detector and the scene, wherein
      a circular first filter portion of the cold-shield filter passes infrared light of the first infrared wavelength band and the second infrared wavelength band, wherein the first infrared wavelength band comprises wavelengths less than wavelengths of the second infrared wavelength band, and
      an annular second filter portion of the cold-shield filter does not pass infrared light of the first infrared wavelength band and passes infrared light of the second infrared wavelength band, and wherein an outer diameter of the circle is an inner diameter of the annulus;
   a cooler housing enclosing the infrared detector and the cold-shield filter, wherein the cooler housing includes a window to admit the beam path to an interior of the cooler housing; and
   a telescope and an imager lying on the beam path, wherein the telescope and the imager image the scene onto the infrared detector.

11. The sensor system of claim 10, wherein the first infrared wavelength band is from about 3 to about 5 micrometers wavelength, and the second infrared wavelength band is from about 8 to about 12 micrometers wavelength.

12. The sensor system of claim 10, wherein the cold-shield filter comprises
   a substrate having a first substrate portion corresponding to the first filter portion and a second substrate portion corresponding to the second filter portion, and
   a second multilayer bandpass coating overlying the second substrate portion.

13. The sensor system of claim 10, wherein the cold-shield filter comprises
   a substrate having a first substrate portion corresponding to the first filter portion and a second substrate portion corresponding to the second filter portion,
   a first multilayer bandpass coating overlying the first substrate portion, and
   a second multilayer bandpass coating overlying the second substrate portion.

14. The sensor system of claim 10, wherein the cold-shield filter has an optical aberration corrector affixed thereto overlying at least the second portion of the cold-shield filter.

15. A sensor system for sensing a scene, the sensor system comprising:
   a dual-band imaging detector lying on a beam path from the scene, wherein the detector detects images in a first wavelength band and in a second wavelength band;
   a two-color cold-shield filter lying on the beam path between the detector and the scene, wherein
      a first filter portion of the cold-shield filter passes light of the first wavelength band and the second wavelength band, and
      a second filter portion of the cold-shield filter does not pass light of the first wavelength band and passes light of the second wavelength band; and
   an optical aberration corrector for the cold-shield filter, wherein the optical aberration corrector lies in the beam path.

16. The sensor system of claim 15, wherein the first filter portion is a circle centered on the beam path, and the second filter portion is a circular annulus centered on the beam path.

17. The sensor system of claim 15, wherein the first filter portion, is a circle centered on the beam path, and the second filter portion is a circular annulus centered on the beam path, and wherein an outer diameter of the circle is an inner diameter of the annulus.

18. The sensor system of claim 15, wherein the first wavelength band comprises wavelengths less than wavelengths of the second wavelength band.

19. The sensor system of claim 15, wherein the first wavelength band is from about 3 to about 5 micrometers wavelength, and the second wavelength band is from about 8 to about 12 micrometers wavelength.

20. The sensor system of claim 15, further including:
a cooler housing enclosing the detector and the cold-shield filter, wherein the cooler housing includes a window to admit the beam path to an interior of the cooler housing.

21. The sensor system of claim 15, wherein the cold-shield filter comprises;
a substrate having a first substrate portion corresponding to the first filter portion and a second substrate portion corresponding to the second filter portion,
a first multilayer bandpass coating overlying the first substrate portion, and
a second multilayer bandpass coating overlying the second substrate portion.

22. The sensor system of claim 15, wherein the cold-shield filter comprises:
a substrate having a first substrate portion corresponding to the first filter portion and a second substrate portion corresponding to the second filter portion, and
a second multilayer bandpass coating overlying the second substrate portion.

23. A sensor system for sending a scene, the sensor system comprising:
a dual-band imaging infrared detector lying on a beam path from the scene, wherein the infrared detector detects infrared images in a first infrared wavelength band and in a second infrared wavelength band;
a two-color cold-shield filter lying on the beam path between the infrared detector and the scene, wherein
a circular first filter portion of the cold-shield filter passes infrared light of the first infrared wavelength band and the second infrared wavelength band, wherein the first infrared wavelength band comprises wavelengths less than wavelengths of the second infrared wavelength band,
an annular second filter portion of the cold-shield filter does not pass infrared light of the first infrared wavelength band and passes infrared light of the second infrared wavelength band, and wherein an outer diameter of the circle is an inner diameter of the annulus, and
the cold-shield filter has an optical aberration corrector affixed thereto overlying at least the second portion of the cold-shield filter; and
a cooler housing enclosing the infrared detector and the cold-shield filter, wherein the cooler housing includes a window to admit the beam path to an interior of the cooler housing.

24. The sensor system of claim 23, wherein the first infrared wavelength band is from about 3 to about 5 micrometers wavelength, and the second infrared wavelength band is from about 8 to about 12 micrometers wavelength.

25. The sensor system of claim 23, wherein the cold-shield filter comprises:
a substrate having a first substrate portion corresponding to the first filter portion and a second substrate portion corresponding to the second filter portion, and
a second multilayer bandpass coating overlying the second substrate portion.

26. The sensor system of claim 23, wherein the cold-shield filter comprises:
a substrate having a first substrate portion corresponding to the first filter portion and a second substrate portion corresponding to the second filter portion,
a first multilayer bandpass coating overlying the first substrate portion, and
a second multilayer bandpass coating overlying the second substrate portion.

* * * * *